(12) United States Patent
Ohsawa

(10) Patent No.: US 7,088,629 B2
(45) Date of Patent: Aug. 8, 2006

(54) SEMICONDUCTOR MEMORY DEVICE

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 10/901,237

(22) Filed: Jul. 29, 2004

(65) Prior Publication Data

US 2005/0226070 A1    Oct. 13, 2005

(30) Foreign Application Priority Data

Apr. 6, 2004 (JP) .............................. 2004-112229

(51) Int. Cl.
*G11C 7/00* (2006.01)
(52) U.S. Cl. ................... 365/205; 365/207; 365/210
(58) Field of Classification Search ...................... None
See application file for complete search history.

(56) References Cited

U.S. PATENT DOCUMENTS

| | | | | |
|---|---|---|---|---|
| 5,949,729 A | * | 9/1999 | Suyama et al. | ............. 365/207 |
| 6,111,778 A | * | 8/2000 | MacDonald et al. | ........ 365/149 |
| 6,538,916 B1 | | 3/2003 | Ohsawa | |
| 6,621,725 B1 | | 9/2003 | Ohsawa | |
| 6,819,613 B1 | * | 11/2004 | Takemura et al. | .......... 365/205 |
| 6,888,770 B1 | * | 5/2005 | Ikehashi | ..................... 365/205 |

OTHER PUBLICATIONS

S. Okhonin, et al., "Principles of Transient Charge Pumping on Partially Depleted SOI MOSFETs", IEEE Electron Device Letters, vol. 23, No. 5, May 2002, pp. 279-281.
Takashi Ohsawa, et al., "Memory Design Using One-Transistor Gain Cell on SOI", IEEE ISSCC, Session 9, Dram and Ferroelectric Memories, 9.1, 2002, (4 pgs.).
U.S. Appl. No. 10/882,354, filed Jul. 2, 2004, Ohsawa.
U.S. Appl. No. 10/901,237, filed Jul. 29, 2004, Ohsawa.

* cited by examiner

*Primary Examiner*—David Lam
(74) *Attorney, Agent, or Firm*—Oblon, Spivak, McClelland, Maier & Neustadt, P.C.

(57) ABSTRACT

A semiconductor memory device includes memory cell arrays; bit lines; word lines; a column selection line; and a sense amplifier comprising a first sense node connected to the first bit line, a second sense node connected to the second bit line, a first cross couple including two switching elements of first conduction type connected in series between the first sense node and the second sense node, and a second cross couple including two switching elements of second conduction type connected in series between the first sense node and the second sense node, a first node between the two switching elements in the first cross couple and a second node between the two switching elements in the second cross couple being connected to different power supplies via a plurality of routes, the sense amplifier selecting the routes on the basis of a potential on the column selection line.

20 Claims, 12 Drawing Sheets

ND DEVICE

CROSS-REFERENCE TO RELATED APPLICATIONS

This application is based upon and claims the benefit of priority from the prior Japanese Patent Applications No. 2004-112229, filed on Apr. 6, 2004, the entire contents of which are incorporated herein by reference.

BACKGROUND OF THE INVENTION

1. Field of the Invention

The present invention relates to a semiconductor memory device.

2. Related Background Art

As for the conventional 1T-1C (one transistor-one capacitor) DRAM cell, its fabrication is becoming difficult as it becomes finer. As an alternative memory cell, an FBC (Floating Body Cell) is proposed. In the FBC, an element unit for storing one bit information is formed of one MIS (Metal Insulator Semiconductor) FET. Therefore, the occupation area of one cell is small. According to the FBC, therefore, memory elements having a large capacity can be formed in a unit area.

The conventional FBC is connected to a sense amplifier via a bit line selection circuit. Therefore, the bit line selection circuit selects one bit line from among a plurality of bit lines (for example, eight bit lines), and a sense amplifier detects data from the selected bit line as described in T. Ohsawa et al., "Memory Design Using One-transistor Gain Cell on SOI," IEEE ISSCC (International Solid-State Circuits Conference), February 2002 (hereafter referred to as Non-Patent Document 1). Such a configuration is based on that data can be read out from a memory cell nondestructively. In other words, it has been considered that data of memory cells that are included in memory cells connected to a selected word line and that are not subjects of data readout remain unchanged from their states preceding the selection, when the word line has restored to its data holding level again without destroying the data.

However, it has been found that the charge pumping phenomenon affects memory cell data. The charge pumping phenomenon is a phenomenon that holes gradually disappear at an interface between a body surface and a gate insulation film when an inversion state and an accumulation state at the body surface of the memory cell are repetitively generated by raising and lowering the voltage on the word line as described in S. Okhonin et al., "Principles of Transients Charge Pumping on Partially Depleted SOI MOSFETs," IEEE ELECTRON DEVICE LETTERS, VOL. 23, NO. 5, MAY 2002 (hereafter referred to as Non-Patent Document 2). The number of holes that disappear due to one state change of inversion and accumulation depends on a density Nit of an interface level between the body surface and the gate insulation film and an area S of the interface. For example, supposing that $Nit=1\times 10^{10}$ $cm^{-2}$, and W (channel width)/L (channel length) of a memory cell transistor=0.1 μm/0.1 μm, $S=W*L=1.0\times 10^{-10}$ $cm^2$ and the number (Nit*S) of interface levels becomes approximately one. The number of holes stored in the body region of the FBC of this generation has a difference of approximately 1,000 depending upon whether the data is "1" or "0." If the voltage raising and lowering on the word line are conducted approximately 1,000 times, therefore, data "1" completely changes to data "0." As a matter of fact, if the voltage raising and lowering on the word line are conducted approximately 500 times, then the risk that the data "1" will be erroneously detected becomes high.

In this way, the FBC is neither a destructive read-out cell nor a complete non-destructive read-out cell. The FBC is so to speak a "quasi non-destructive read-out cell."

Therefore, a semiconductor memory device, which is capable of preventing the charge pumping phenomenon of the FBC memory with low power consumption, is demanded.

SUMMARY OF THE INVENTION

A semiconductor memory device according to an embodiment of the invention comprises a memory cell including a floating body region assuming an electrical floating state, and storing data by storing charge in the floating body region or by discharging therefrom; memory cell arrays including a plurality of the memory cells arranged along a column and a row; a plurality of bit lines respectively provided in columns of the memory cell array and connected to the memory cells disposed along the respective columns; a plurality of word lines respectively provided in rows of said memory cell array and connected to the memory cells disposed along the respective rows; a column selection line to select a bit line to read/write data from/into the memory cells; and a sense amplifier connected to a first bit line and a second bit line in a memory cell array via transfer gates, the sense amplifier comprising a first sense node connected to the first bit line via a transfer gate, a second sense node connected to the second bit line via a transfer gate, a first cross couple including two switching elements of first conduction type connected in series between the first sense node and the second sense node, and a second cross couple including two switching elements of second conduction type connected in series between the first sense node and the second sense node, a first node between the two switching elements in the first cross couple and a second node between the two switching elements in the second cross couple being respectively connected to different power supplies via a plurality of routes, the sense amplifier selecting the routes on the basis of a potential on the column selection line.

A semiconductor memory device according to another embodiment of the invention comprises a memory cell including a floating body region assuming an electrical floating state, and storing data by storing charge in the floating body region or discharging therefrom; memory cell arrays each including a plurality of the memory cells arranged along a column and a row; a plurality of bit lines respectively provided in columns of the memory cell array and connected to the memory cells disposed along the respective columns; a plurality of word lines respectively provided in rows of said memory cell array and connected to the memory cells disposed along the respective rows; a column selection line to select a bit line for reading/writing data from/into the memory cells; and a sense amplifier respectively connected to a first bit line and a second bit line in a memory cell array via transfer gates, wherein when in the sense amplifier the first and second bit lines are unselected at the time of reading/writing, the sense amplifier reading data in a memory cell connected to the first bit line and a selected word line by using the first bit line, and reading reference data serving as reference when detecting data in the memory cell by using the second bit line, then the sense amplifier applying a supplement voltage to the first bit line, the supplement voltage lying between a reading/writing potential to be applied to a bit line selected for reading/writing and the ground potential.

DETAILED DESCRIPTION OF THE INVENTION

Hereafter, embodiments according to the present invention will be described with reference to the drawings. These embodiments do not limit the present invention.

FIRST EMBODIMENT

In the present embodiment, data is read out from one memory cell that is included in memory cells connected to an activated word line and that is connected to a bit line selected by a column selection line, or data is written into the memory cell. In the present embodiment, a sense amplifier is provided for each bit line pair. A sense amplifier connected to a bit line that is a selection subject of reading/writing (hereafter referred to as selected sense amplifier) supplies a potential to the bit line in order to read/write data. A sense amplifier connected to a bit line that is not a selection subject of reading/writing (hereafter referred to as unselected sense amplifier) supplies a potential to the bit line in order to compensate for holes that disappear due to the charge pumping phenomenon.

Figure 1:
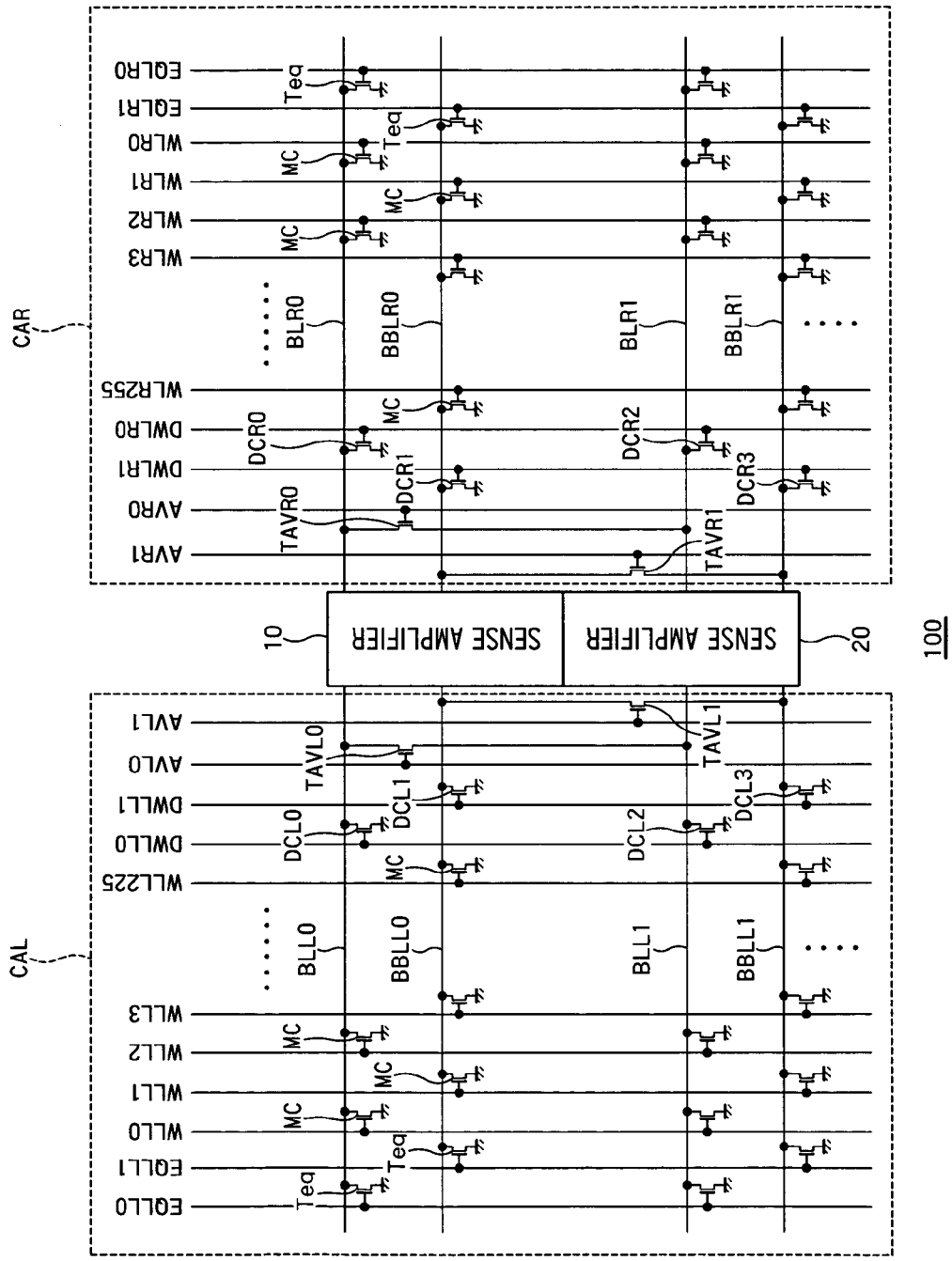
FIG. 1 is a circuit diagram of a memory portion of a semiconductor memory device 100 in a first embodiment according to the present invention.

FIG. 1 is a circuit diagram of a memory portion of a semiconductor memory device 100 in a first embodiment according to the present invention. The semiconductor memory device 100 includes memory cell arrays CAL and CAR, and sense amplifiers 10 and 20. Each of the memory cell arrays CAL and CAR includes a plurality of memory cells MC arranged along a column and a row.

Each of the memory cells MC includes a floating body region (hereafter referred to simply as body region), which is in an electrically floating state. By storing charge in the body region or by discharge from the body region, data is stored. In the present embodiment, a state in which more holes are stored in the body region is regarded as data "1," and a state in which less holes are stored in the body region is regarded as data "0." As for the concrete configuration of each memory cell MC, for example, the configuration of the FBC memory cell described in the Non-Patent Document 1 may be used.

In the memory cell array CAL, word lines WLL0 to WLL225 are provided respectively in rows, and connected to gates of memory cells MC arranged along the rows. In the memory cell array CAR, word lines WLR0 to WLR225 are provided respectively in rows, and connected to gates of memory cells MC arranged along the rows. Furthermore, in the memory cell arrays CAL and CAR, bit lines are provided respectively in columns, and connected to drains of memory cells MC arranged along the columns. The memory cells MC are shifted by half pitch in rows and columns. The memory cells MC are provided at alternate intersections of word lines and bit lines. Therefore, memory cells MC connected to adjacent bit lines are connected to mutually different word lines.

Sense amplifiers 10 and 20 are provided between the memory cell arrays CAL and CAR, and connected to bit lines in both the memory cell arrays CAL and CAR. In the present embodiment, the sense amplifier 10 is connected to bit lines BLL0 and BBLL0 in the memory cell array CAL and bit lines BLR0 and BBLR0 in the memory cell array CAR, and the sense amplifier 20 is connected to bit lines BLL1 and BBLL1 in the memory cell array CAL and bit lines BLR1 and BBLR1 in the memory cell array CAR.

The bit lines BLL0 and BBLL0, the bit lines BLL1 and BBLL1, the bit lines BLR0 and BBLR0 and the bit lines BLR1 and BBLR1 respectively constitute bit line pairs. In each bit line pair, one bit line is used to transfer memory data stored in a memory cell MC, whereas the other bit line is used to transfer reference data, which becomes reference when detecting the memory data. In other words, the present embodiment has a folded bit line configuration. Furthermore, in the present embodiment, the sense amplifiers 10 and 20 constitute one sense amplifier pair in order to generate reference data.

EQLL0, EQLL1, EQLR0 and EQLR1 disposed at ends of the bit lines are provided to set respective bit lines to the ground potential during precharge period. Therefore, transistors Teq connected to the EQLL0, EQLL1, EQLR0 and EQLR1 may have the same structures as the memory cells MC, but the transistors Teq do not function as memory cells but as switching MOSFETs. Furthermore, a dummy word line DWLL0 is connected to dummy cells DCL0 and DCL2, and a dummy word line DWLL1 is connected to dummy cells DCL1 and DCL3. A dummy word line DWLR0 is connected to dummy cells DCR0 and DCR2, and a dummy word line DWLR1 is connected to dummy cells DCR1 and DCR3. Each of the dummy cells DCL0, DCL1, DCR0 and DCR1 has data "0" written therein, and each of the dummy cells DCL2, DCL3, DCR2 and DCR3 has data "1" written therein.

Between the sense amplifiers 10 and 20 and the dummy word lines, transistors $T_{AVL0}$, $T_{AVL1}$, $T_{AVR0}$ and $T_{AVR1}$ are provided. The transistors $T_{AVL0}$, $T_{AVL1}$, $T_{AVR0}$ and $T_{AVR1}$ can short-circuit respectively the bit line BLL0 to BLL1, the bit line BBLL0 to BBLL1, the bit line BLR0 to BLR1, and the bit line BBLR0 to BBLR1 in order to generate the reference data.

Figure 4:
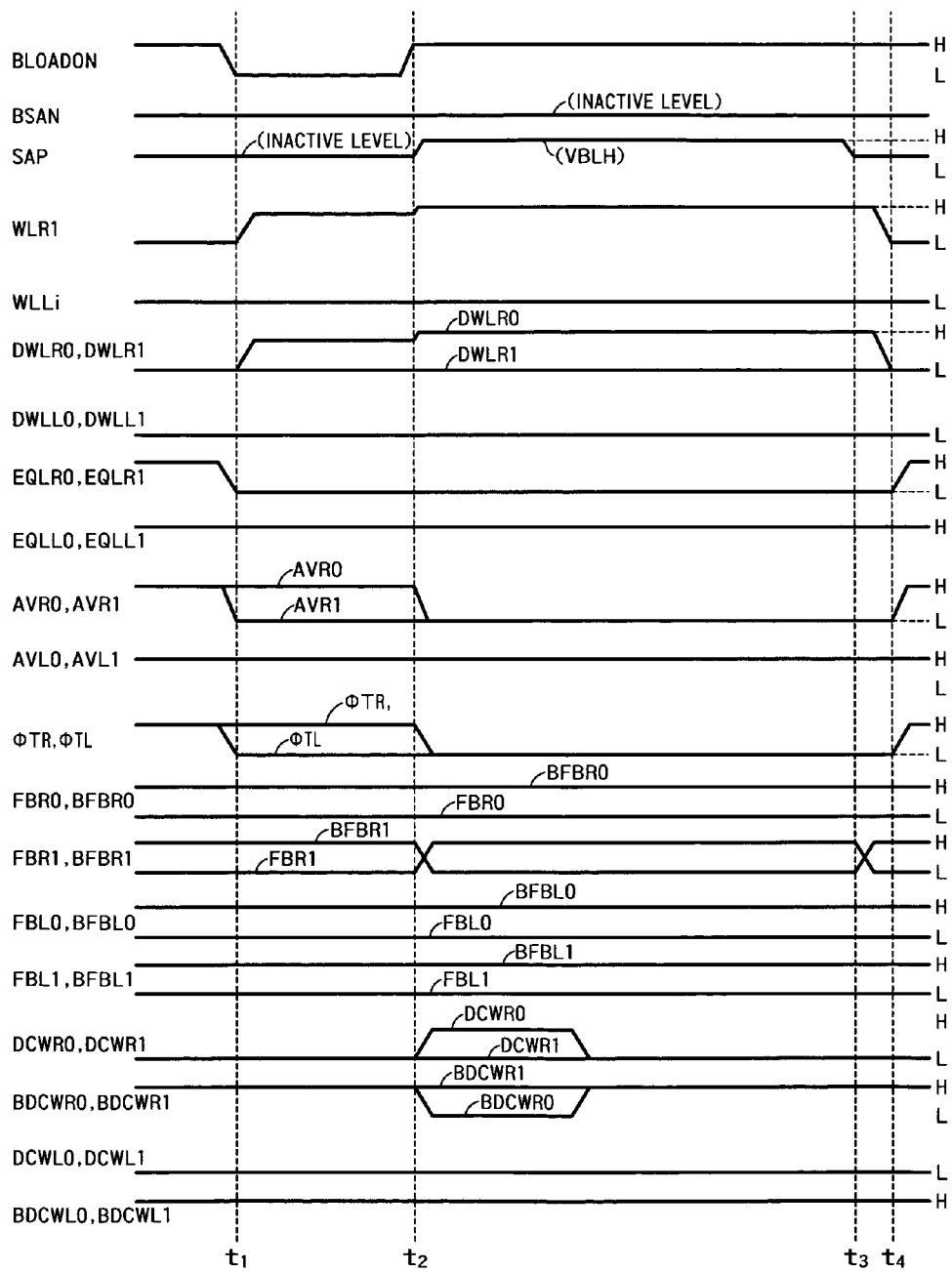
FIG. 4 is a timing diagram showing potential levels on respective signal lines.

In one case where the transistors $T_{AVL0}$ and $T_{AVL1}$ and the transistors $T_{AVR0}$ and $T_{AVR1}$ are off at the time of data holding, only one of the transistors $T_{AVL0}$ and $T_{AVL1}$ is in the on-state and only one of the transistors $T_{AVR0}$ and $T_{AVR1}$ is in the on-state while generating reference data (at the time of signal development). In this case, both of the transistors $T_{AVL0}$ and $T_{AVL1}$ or both of the transistors $T_{AVR0}$ and $T_{AVR1}$ do not turn on. In the other case where the transistors $T_{AVL0}$ and $T_{AVL1}$ and the transistors $T_{AVR0}$ and $T_{AVR1}$ are on-state at the time of data holding, only one of the transistors $T_{AVL0}$ and $T_{AVL1}$ is in the off-state and only one of the transistors $T_{AVR0}$ and $T_{AVR1}$ is in the off-state while generating reference data (at the time of signal development). In this case, both of the transistors $T_{AVL0}$ and $T_{AVL1}$ or both of the transistors $T_{AVR0}$ and $T_{AVR1}$ do not turn off. Incidentally, FIG. 4 shows the case when both the transistors $T_{AVL0}$ and $T_{AVL1}$ are on-state at the time of data holding and also both the transistors $T_{AVR0}$ and $T_{AVR1}$ are on-state at the time of data holding.

In FIG. 1, only four bit lines are shown. However, four or more bit lines may be provided in each of the memory cell arrays CAL and CAR. In this case, it is desirable that the number of bit lines is a multiple of 4 in order to constitute sense amplifier pairs.

Figure 2:
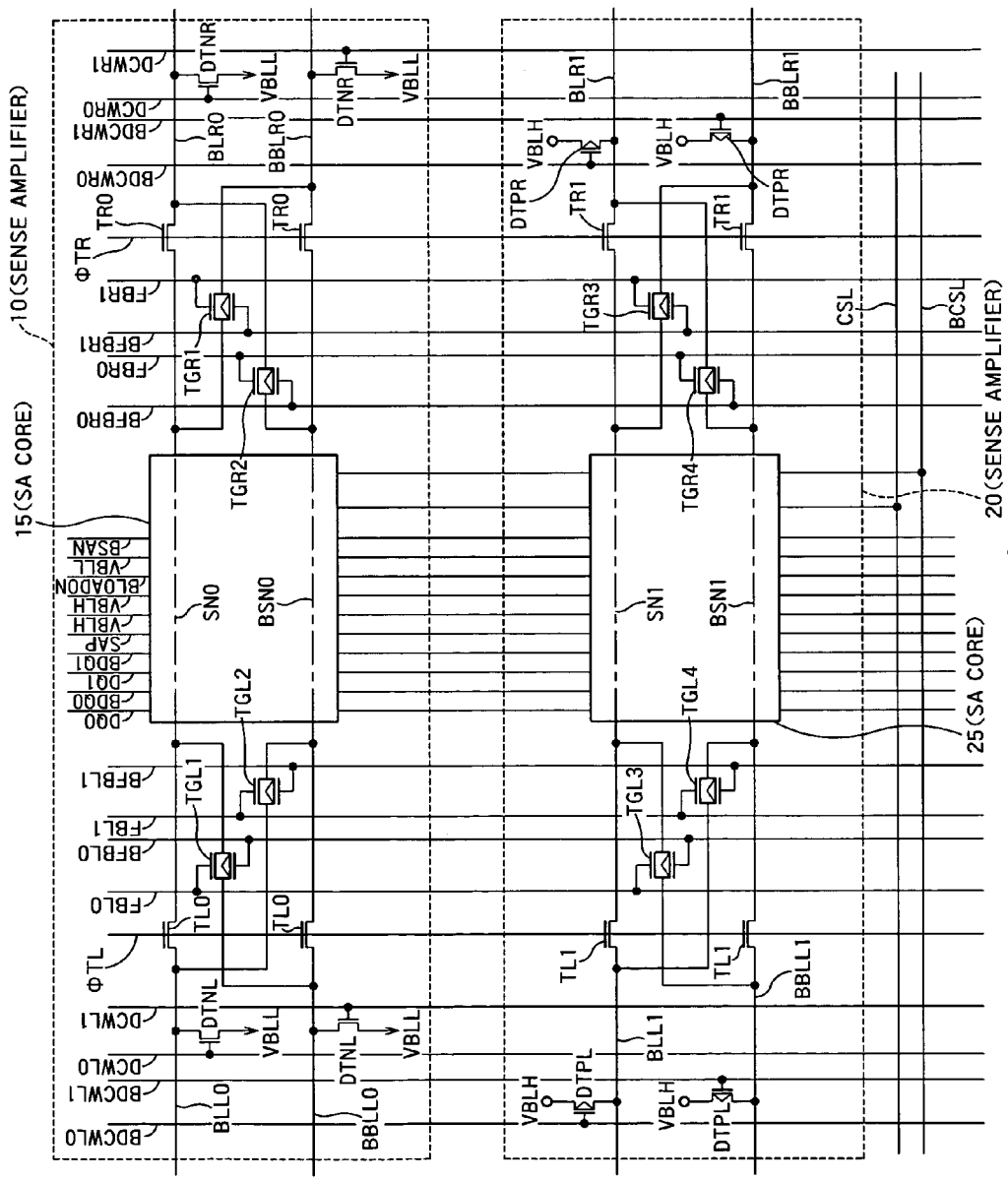
FIG. 2 is a circuit diagram showing internal configurations of sense amplifiers 10 and 20 in detail.

FIG. 2 is a circuit diagram showing internal configurations of sense amplifiers 10 and 20 in detail. The sense amplifiers 10 and 20 includes sense amplifier core portions (hereafter referred to as SA cores) 15 and 25 for amplifying data stored in memory cells MC, respectively.

Transistors TL0 are provided between the SA core 15 and the bit lines BLL0, BBLL0 as transfer gates. Transistors TL1 are provided between the SA core 25 and the bit lines BLL1, BBLL1 as transfer gates. Transistors TR0 are provided between the SA core 15 and the bit lines BLR0, BBLR0 as transfer gates. Transistors TR1 are provided between the SA core 25 and the bit lines BLR1, BBLR1 as transfer gates. These transistors TL and TR can connect/disconnect the bit lines to/from the SA cores 15 and 25 under the control of signals ΦTL and ΦTR, respectively. For convenience, bit lines located on the SA core 15 side with respect to the transistor TL0 or TR0 are referred to respectively as sense node SN0 or BSN0, and bit lines located on the SA core 25 side with respect to the transistor TL1 or TR1 are referred to respectively as sense node SN1 or BSN1.

A transistor DTNL is provided between a low voltage source VBLL for writing data "0" and each of the bit lines BLL0, BBLL0. A transistor DTPL is provided between a high voltage source VBLH for writing data "1" and each of the bit lines BLL1 and BBLL1. A transistor DTNR is provided between the low voltage source VBLL and each of the bit lines BLR0 and BBLR0. A transistor DTPR is provided between the high voltage source VBLH and each of the bit lines BLR1 and BBLR1.

As a result, the transistor DTNL brings the bit lines BLL0 and BBLL0 to VBLL in potential on the basis of a potential on DCWL0 and DCWL1, and writes data "0" into the dummy cells DCL0 and DCL1. The transistor DTPL brings the bit lines BLL1 and BBLL1 to VBLH in potential on the basis of a potential on BDCWL0 and BDCWL1, and writes data "1" into the dummy cells DCL2 and DCL3. The transistor DTNR brings the bit lines BLR0 and BBLR0 to VBLL in potential on the basis of a potential on DCWR0 and DCWR1, and writes data "0" into the dummy cells DCR0 and DCR1. The transistor DTPR brings the bit lines BLR1 and BBLR1 to VBLH in potential on the basis of a potential on BDCWR0 and BDCWR1, and writes data "1" into the dummy cells DCR2 and DCR3.

The transistors DTNL, DTPL, DTNR and DTPR are disposed on the bit line side with respect to the transistors TL0, TL1, TR0 and TR1, respectively. No matter whether the bit lines are connected to the SA cores 15 and 25, therefore, data can be written into the dummy cells DCL0, DCL1, DCL2, DCL3, DCR0, DCR1, DCR2 and DCR3.

Transfer gates TGL1 to TGL4 and TGR1 to TGR4 are provided between the sense node SN0 and the bit line BBLL0, between the sense node BSN0 and the bit line BLL0, between the sense node SN1 and the bit line BBLL1, between the sense node BSN1 and the bit line BLL1, between the sense node SN0 and the bit line BBLR0, between the sense node BSN0 and the bit line BLR0, between the sense node SN1 and the bit line BBLR1 and between the sense node BSN1 and the bit line BLR1, respectively. These transfer gates TGL1 to TGL4 and TGR1 to TGR4 are used when writing back data stored in the SA core 15 or 25 into memory cells MC.

Column selection lines CSL and BCSL are connected to the SA cores 15 and 25 in common. A bit line and a sense amplifier for reading/writing are selected by the column selection lines CSL and BCSL. In other words, a selected sense amplifier and an unselected sense amplifier are determined by potentials on the column selection lines CSL and BCSL.

Figure 3:
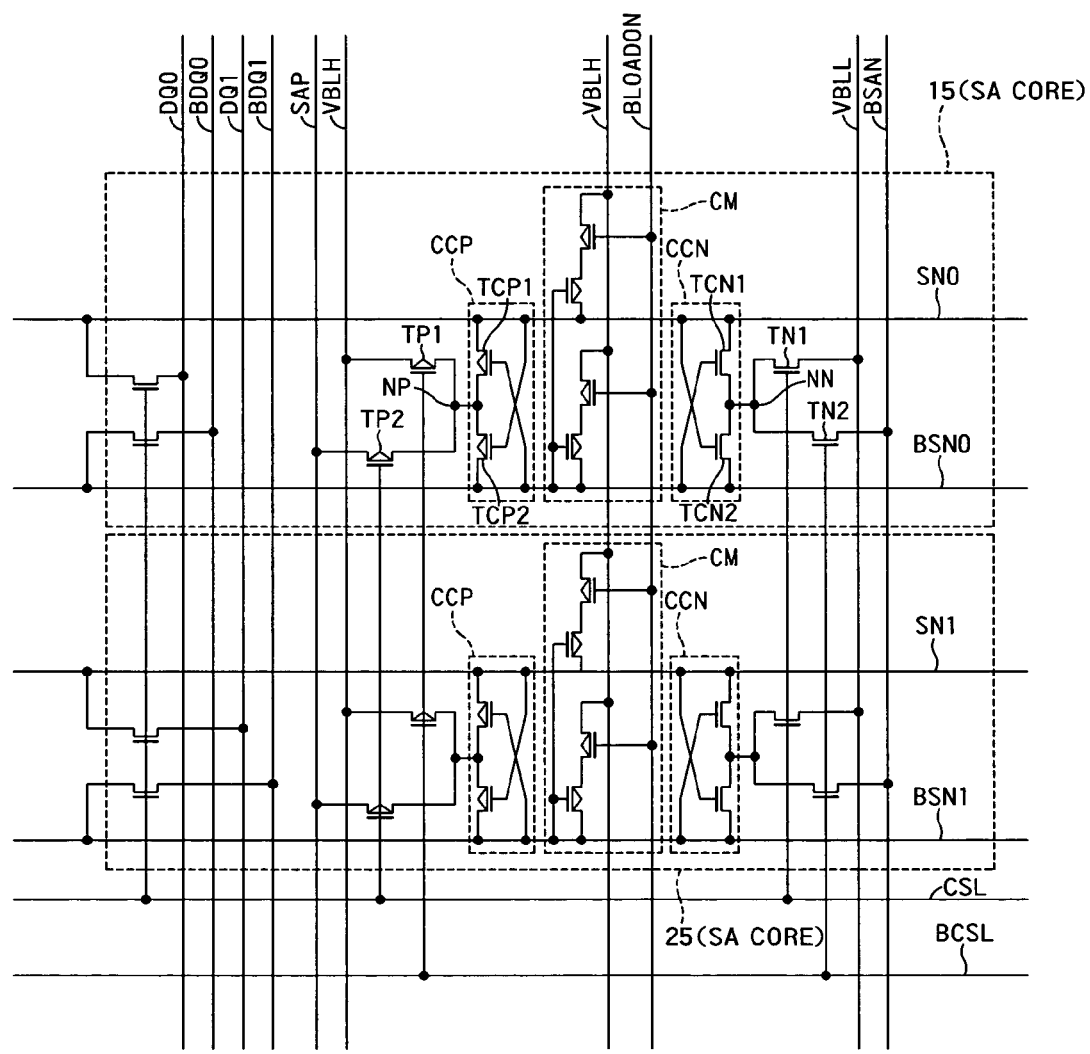
FIG. 3 is a circuit diagram showing internal configurations of SA cores 15 and 25 in detail.

FIG. 3 is a circuit diagram showing internal configurations of the SA cores 15 and 25 in detail. Since the SA cores 15 and 25 have similar configurations, the SA core 15 will now be described and description of the SA core 25 will be omitted.

The SA core 15 includes a first cross couple CCP, a second cross couple CCN, and transistors TP1, TP2, TN1 and TN2. The cross couple CCP includes transistors TCP1 and TCP2 as switching elements connected in series between the sense nodes SN0 and BSN0. A gate of the transistor TCP1 connected on the sense node SN0 side is connected to the sense node BNS0, and a gate of the transistor TCP2 connected on the sense node BSN0 side is connected to the sense node SN0. As a result, the transistors TCP1 and TCP2 constitute the cross couple. The cross couple CCN includes transistors TCN1 and TCN2 as switching elements connected in series between the sense nodes SN0 and BSN0. A gate of the transistor TCN1 connected on the sense node SN0 side is connected to the sense node BNS0, and a gate of the transistor TCN2 connected on the sense node BSN0 side is connected to the sense node SN0. As a result, the transistors TCN1 and TCN2 also constitute the cross couple.

A source node NP between the transistors TCP1 and TCP2 is connected to the first power supply VBLH via the transistor TP1 as a first path, and connected to a third power supply SAP via the transistor TP2 as a second path. A source node NN between the transistors TCN1 and TCN2 is connected to the second power supply VBLL via the transistor TN1 as a third path, and connected to a fourth power supply BSAN via the transistor TN2 as a fourth path.

The power supply VBLH is a voltage source having a high potential (for example, 2.3 V) for writing data "1" into a memory cell MC, and the power supply VBLL is a voltage source having a low potential (for example, −1.0 V) for writing data "0" into the memory cell MC. In the present embodiment, the voltage signal source SAP can generate the same potential as that at the power supply VBLH at timing shown in FIG. 4. A potential at the power supply BSAN maintains inactivity, i.e., 0 V.

In addition, the SA core 15 includes a current mirror circuit CM. The current mirror circuit CM lets a current flow to each of the sense nodes SN0 and BSN0 on the basis of a signal at BLOADON.

Figure 5:
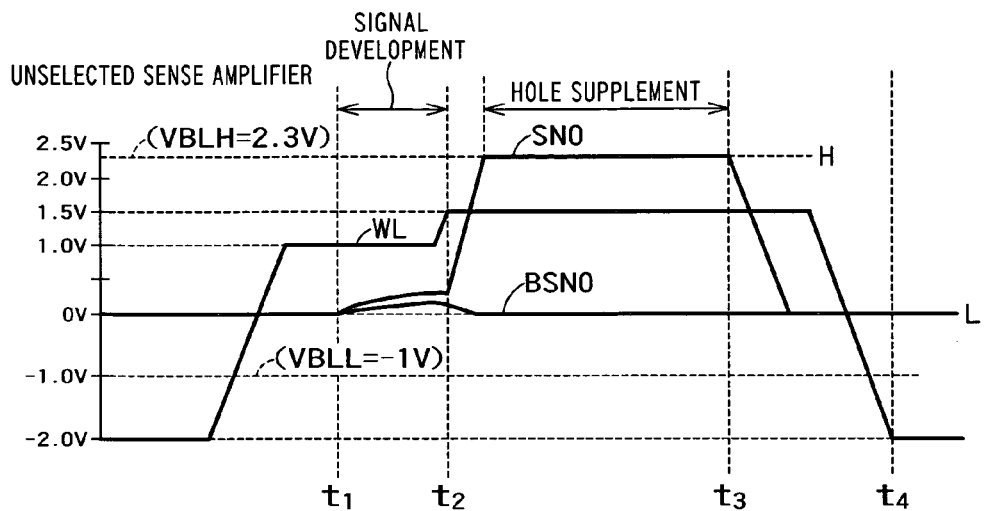
FIG. 5 is a timing diagram showing potential levels at sense nodes SN and BSN in an unselected sense amplifier.
Figure 6:
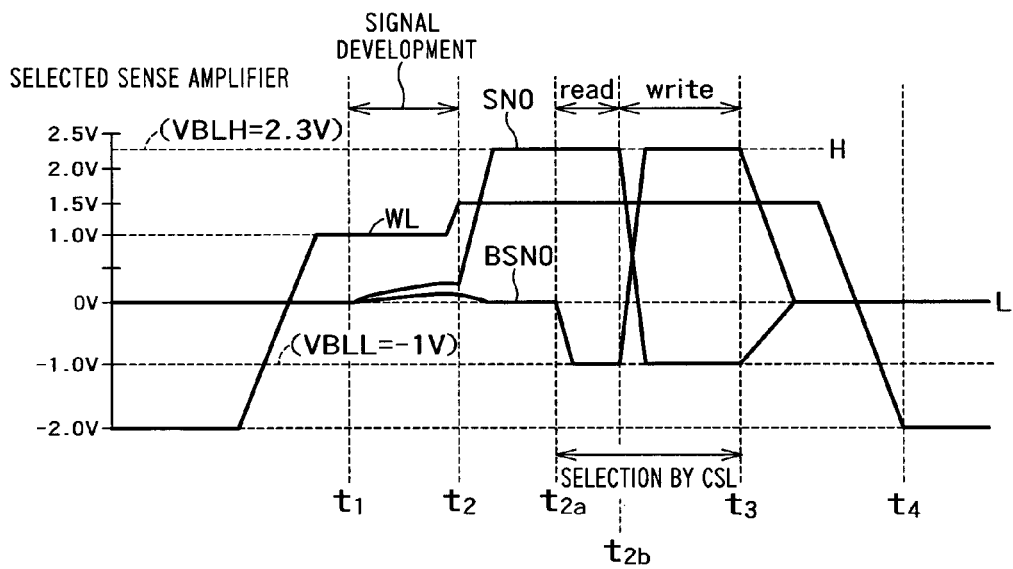
FIG. 6 is a timing diagram showing potential levels at sense nodes SN and BSN in a selected sense amplifier.

FIG. 4 is a timing diagram showing potential levels on respective signal lines. FIG. 5 is a timing diagram showing potential levels at the sense nodes SN and BSN in an unselected sense amplifier. FIG. 6 is a timing diagram showing potential levels at the sense nodes SN and BSN in a selected sense amplifier.

In the present embodiment, the selected sense amplifier supplies a reading/writing potential used to read/write data to a bit line. The unselected sense amplifier supplies a supplement potential used to compensate for holes that disappear due to the charge pumping phenomenon, to a bit line. The reading/writing potential for writing "1" corresponds to the VBLH, and the reading/writing potential for writing "0" corresponds to the VBLL. The supplement potential is VBLH supplied by the power supply SAP or a potential of an inactive level supplied by the BSAN.

If a memory cell MC connected to an unselected sense amplifier has data "1" stored therein, then holes are stored and consequently a countermeasure against the charge pumping phenomenon is needed. If a memory cell MC connected to an unselected sense amplifier has data "0" stored therein, however, then the countermeasure against the charge pumping phenomenon is not needed. Therefore, it is sufficient to supply a supplement potential to only memory cells MC having data "1" stored therein, among memory cells MC connected to an activated word line WL.

The reading/writing potential and the supplement potential may be equal to each other. Since the selected sense amplifier and the unselected sense amplifier are different in purpose of application of a potential to a bit line, however, they may be respectively different potentials. For example, the reading/writing potential needs to be a potential (VBLH or VBLL) sufficient for the selected sense amplifier to read or write data "1" or "0" from each memory cell MC. On the other hand, it is sufficient that the supplement potential is a potential of such a degree as to compensate for holes that disappear due to the charge pumping phenomenon. Specifically, the number of holes that disappear due to the charge pumping phenomenon is approximately one per reading/writing operation, and consequently it is sufficient that the number of holes to be resupplied is approximately several. In other words, it is sufficient that the number of holes to be resupplied is less than the number of holes equivalent to approximately 1,000 injected at the time of writing data "1" by two digits to three digits. Therefore, the supplement potential may be a potential lower than the reading/writing potential. Or even in the case where the reading/writing potential and the supplement potential are equal to each other, an interval (latching time) over which the unselected sense amplifier supplies a potential to a bit line may be shorter than that for the selected sense amplifier.

Hereafter, operation of the sense amplifiers 10 and 20 will be described. It is now supposed that the sense amplifiers 10 and 20 are unselected sense amplifiers and memory cells MC located on bit lines connected to the sense amplifiers and activated by a word line have data "1" stored therein. The sense amplifiers 10 and 20 have a folded bit line configuration. Per reading/writing operation, therefore, the sense amplifiers 10 and 20 are connected to one bit line pair in the memory cell array CAL or CAR, and disconnected from the other bit line pair. Further, it is supposed that the sense amplifiers 10 are connected to the bit line pair BLR0 and BBLR0 in the memory cell array CAR and the sense amplifiers 10 supply a supplement potential to memory cells connected to the bit line BLR0, and that the sense amplifiers 20 are connected to the bit line pair BLR1 and BBLR1 and the sense amplifiers 20 supply a supplement potential to memory cells connected to the bit line BLR1.

(Potentials at Source Nodes NN and NP)

The potentials at source nodes NN and NP will now be described with reference to FIGS. 3 and 4. First, the signal BLOADON having a potential of a high level (hereafter also referred to as "H" level) is changed to a potential of a low level (hereafter also referred to as "L" level) (point t1 in time). Therefore, the current mirror circuit CM is activated and a current flows through memory cells MC. At this time, the word line WLR1 is activated to the H level, and other word lines WLRi (i=0, 2 . . . 255) are kept at the L level. As a result, the potential is supplied to gates of memory cells MC connected to the word line WLR1. Since the sense amplifiers 10 and 20 are unselected sense amplifiers, memory cells included in these activated memory cells MC and connected to the sense amplifiers 10 and 20 are not selected by the column selection line CSL. In this case, the column selection lines CSL and BCSL are respectively at the L level and the H level, and potentials on the BSAN and SAP are respectively supplied to the source nodes NN and NP.

(Generation of Reference Potential)

The signal lines DWLR0 and DWLR1 shown in FIG. 1 respectively becomes the H level and the L level, and signal lines AVR0 and AVR1 respectively becomes the H level and the L level. As a result, the transistor TAVR0 turns on, and the dummy cells DCR0 and DCR2 are short-circuited to each other. Since the dummy cells DCR0 and DCR2 respectively have data "0" and data "1" written therein, the bit lines BLR0 and BLR1 assumes a middle potential between the data "0" and "1." This middle potential is a potential of reference data (hereafter also referred to as reference potential) to be used when the sense amplifiers 10 and 20 detect data in a memory cell.

(Connection/Disconnection of Bit Line)

In addition, at the point t1 in time, the signal line ΦTR is kept at the H level whereas the signal line ΦTL assumes the L level. As a result, the bit lines BLR0, BBLR0, BLR1 and BBLR1 shown in FIG. 2 are connected respectively to the sense nodes SN0, BSN0, SN1 and BSN1, and the bit lines BLL0, BBLL0, BLL1 and BBLL1 are disconnected respectively from the sense nodes SN0, BSN0, SN1 and BSN1. Therefore, it becomes possible for the sense amplifiers 10 and 20 to detect data stored in memory cells MC connected to the bit lines BBLR0 and BBLR1 on the basis of the reference potential on the bit lines BLR0 and BLR1 in the memory cell array CAR. At this time, all of the transfer gates TGR1 to TGR4 and TGL1 to TGL4 are off-state.

(Detection of Memory Data and Latching of Supplement Potential)

Detection of memory data and latching of the supplement potential in the sense amplifier 10 will now be described with reference to FIG. 5. Since the sense amplifier 10 and the sense amplifier 20 are the same in operation, operations at the sense nodes SN0 and BSN0 in the sense amplifier 10 will now be described representatively.

If the bit line BLR0 is connected to the sense node SN0 shown in FIG. 2, then the potential at the sense node SN0 gradually changes on the basis of the reference potential on the bit line BLR0 as represented by an interval between points t1 and t2 in time in FIG. 5. If the bit line BBLR0 is connected to the sense node BSN0 shown in FIG. 2, then the potential at the sense node BSN0 gradually changes on the basis of the potential at the memory cell MC connected to the word line WLR1 as represented by the interval between the points t1 and t2 in time in FIG. 5. In other words, the signals on the bit lines BLR0 and BBLR0 are subjected to signal development in the interval between the points t1 and t2 in time.

At this time, the potential at the sense node BSN0, which transfers the data "1", is lower than the potential at the sense node SN0, which transfers the reference potential. This is because the memory cell MC having data "1" stored therein has holes stored in its body region and consequently its threshold voltage is lowered by the back bias effect.

If the signals on the bit lines BLR0 and BBLR0 are fully developed at the point t2 in time, then the cross couples CCN and CCP shown in FIG. 3 are activated. At this time, the ΦTR shown in FIG. 2 is changed to the L level to disconnect the bit lines BLR0 and BBLR0 respectively from the sense nodes SN0 and BSN0. In the present embodiment, the potential at the sense node BSN0 is lower than the potential at the sense node SN0, and consequently the transistor TCN2 turns on in the cross couple CCN and the potential at the source node NN is transferred to the sense node BSN0. Since the potential at the source node NN is equal to the potential (0 V) at the BSAN as described above, the potential at the sense node BSN0 is amplified to 0 V and latched. On the other hand, the transistor TCP1 turns on in the cross couple CCP, and the potential at the source node NP is transferred to the sense node SN0. Since the potential at the source node NP at this time is equal to that at the power supply VBLH for writing "1", the potential at the sense node SN0 is amplified to VBLH (for example, 2.3 V) and latched. The potential VBLH at the sense node SN0 becomes the supplement potential.

(Supplement of Holes)

Attention should be paid to the fact that the potential VBLH required to write data "1" is generated not at the sense node BSN, which has transferred data at the time of data detection, but at the sense node SN, which has transferred the reference potential. In order to transfer the potential VBLH from the sense node SN0 to the bit line BBLR0, therefore, signal lines FBR1 and BFBR1 become the L level and the H level, respectively, as shown in FIG. 4. As a result, the transfer gate TGR1 shown in FIG. 2 turns on, and the sense node SN0 is connected to the bit line BBLR0. Consequently, the supplement potential (VBLH) is transferred to the bit line BBLR0 to compensate for holes in the memory cell that have disappeared due to the charge pumping phenomenon. By the way, at this time, the transfer gate TGR2 remains off.

Subsequently, at point t3 in time, the potential at the power supply SAP becomes an inactive level as shown in FIG. 4, and the signal lines FBR1 and BFBR1 respectively become the L level and the H level. Therefore, the potential at the sense node BSN becomes the L level, and the transfer gate TGR1 turns off. As a result, the sense amplifier 10 stops voltage application to the memory cell MC, and hole supplement is finished.

Between points t2 and t3 in time, data "0" is written into the dummy cell DCR0 shown in FIG. 1 and data "1" is written into the dummy cell DCR2 by operation of the signal lines DCWR0 and BDCWR0 shown in FIG. 2.

Thereafter, at point t4 in time, the word line WLR1 returns to the L level, and a series of reading/writing operations is finished.

The sense amplifier 20 also functions in the same as the sense amplifier 10. Therefore, the sense amplifier 20 detects data stored in a memory cell MC connected to the bit line BBLR1, and then compensates for holes that disappear due to the charge pumping phenomenon.

Operation of the selected sense amplifier will now be described with reference to FIG. 6. In this case, it is supposed that the sense amplifiers 10 and 20 are selected sense amplifiers for reading/writing data "1." Until a point t2a in time between the points t2 and t3 in time shown in FIG. 6, operation of the selected sense amplifier is similar to the operation of the unselected sense amplifier.

In order to select the sense amplifiers 10 and 20 at the point t2a in time, the column selection lines CSL and BCSL shown in FIG. 2 become the H level and the L level, respectively. As a result, the transistors TN1 and TP1 shown in FIG. 3 turn on and the transistors TN2 and TP2 turn off. Therefore, the source nodes NN and NP respectively become equal to the VBLL (for example −1.0 V) and VBLH (for example 2.3 V). The VBLL is a voltage required to write data "0," and the VBLH is a voltage required to write data "1."

The source nodes NN and NP are already connected to the sense nodes BSN0 and SN0, respectively. As shown in FIG. 6, therefore, the potentials at the sense nodes BSN0 and SN0 become the VBLL (−1.0 V) and the VBLH (2.3 V), respectively. In this way, data is read out from the memory cell MC between points t2a and t2b in time.

In addition, after the point t2 in time, the transfer fate TGR1 shown in FIG. 2 turns on, and the sense node SN0 is connected to the bit line BBLR0. This is because the potential VBLH required to write data "1" is generated not at the sense node BSN, which has transferred the data, but at the sense node SN, which has transferred the reference potential. As a result, data "1" can be written into the memory cell MC that has stored the data "1," again. Thereafter, after the point t3 in time, the selected sense amplifier operates in the same way as the unselected sense amplifier.

The sense amplifier 20 also executes the reading/writing operation in the same as the sense amplifier 10. In reading/writing operation of data "0," a graph of the sense amplifier SN becomes a graph of the sense amplifier BSN shown in FIG. 6 and a graph of the sense amplifier BSN becomes a graph of the sense amplifier SN shown in FIG. 6.

Furthermore, in the present embodiment, the reference voltage is generated by short-circuiting the bit lines BLR0 and BLR1 shown in FIG. 1 to each other, and data of the memory cell MC connected to the bit lines BBLR0 and BBLR1 are detected. On the contrary, however, it is also possible to generate the reference voltage by short-circuiting the bit lines BBLR0 and BBLR1 to each other and detect data of the memory cell MC connected to the bit lines BLR0 and BLR1. In this case, graphs of the sense amplifier SN shown in FIGS. 5 and 6 become graphs of the sense amplifier BSN and graphs of the sense amplifier BSN become graphs of the sense amplifier SN.

In the present embodiment, a memory cell connected to an unselected sense amplifier and connected to an activated word line is supplemented with holes as shown in FIG. 5. As a result, the charge pumping phenomenon in this memory cell can be prevented.

In the present embodiment, the sense node BSN in the unselected sense amplifier is not lowered as far as a potential (for example, the potential VBLL for writing "0") lower than 0 V as shown in FIG. 5. Therefore, the unselected sense amplifier is lower in power consumption than the selected sense amplifier. There are only two selected sense amplifiers and other sense amplifiers are unselected sense amplifiers. Therefore, the effect of power consumption reduction in the unselected sense amplifiers is significant.

In addition, among the memory cells connected to the activated word line, memory cells that need to be supplemented with holes are only memory cells having data "1" stored therein. Although an unselected sense amplifier connected to memory cells having data "0" stored therein also operates as shown in FIG. 5, therefore, the high voltage is not fed back to the bit line side. The power consumption in the unselected sense amplifier is further reduced.

SECOND EMBODIMENT

Figure 7:
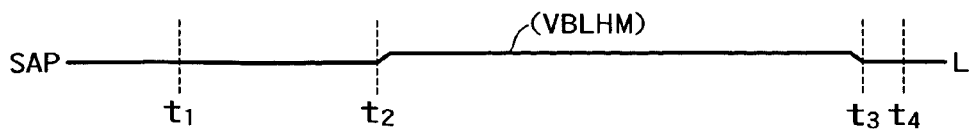
FIG. 7 is a timing diagram showing potential levels on respective signal lines in a second embodiment.

A second embodiment differs from the first embodiment in that the potential at the power supply SAP becomes VBLHM (for example, 1.5 V) which lies between 0 V and the potential VBLH (for example, 2.3 V) as shown in FIG. 7. A semiconductor memory device according to the second embodiment may have a configuration similar to that of the first embodiment shown in FIGS. 1 to 3. Furthermore, operation of signal lines other than the power supply SAP may be similar to that shown in FIG. 4.

Figure 8:
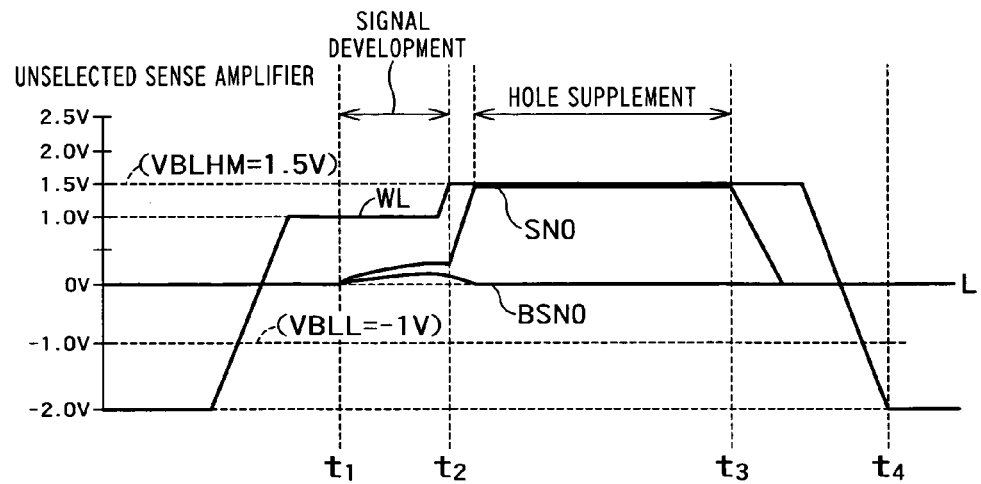
FIG. 8 is a timing diagram showing potential levels at sense nodes SN and BSN in an unselected sense amplifier in a second embodiment.
Figure 9:
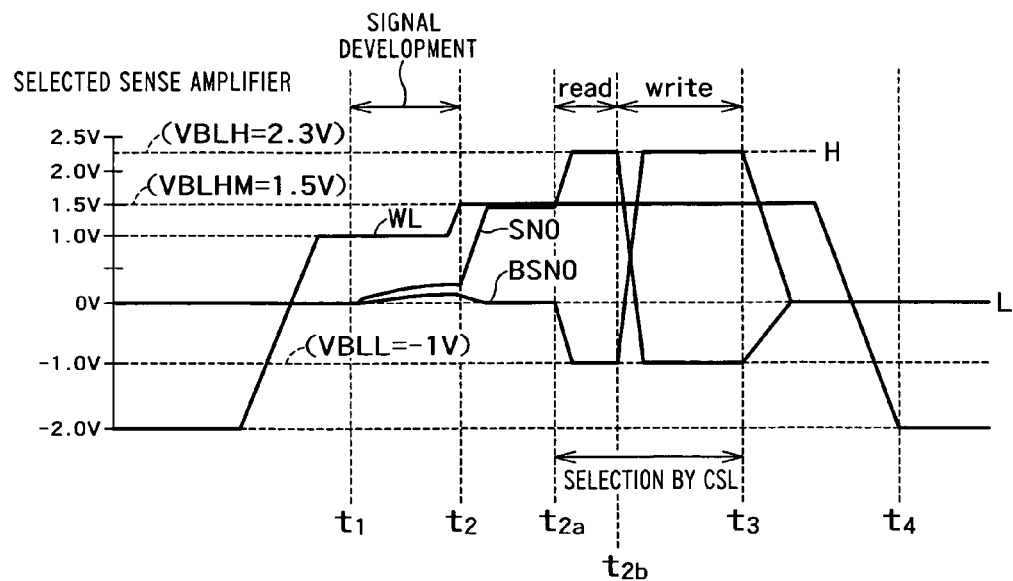
FIG. 9 is a timing diagram showing potential levels at sense nodes SN and BSN in a selected sense amplifier in a second embodiment.

FIG. 8 is a timing diagram showing potential levels at the sense nodes SN0 and BSN0 in an unselected sense amplifier in the second embodiment. FIG. 9 is a timing diagram showing potential levels at the sense nodes SN0 and BSN0 in a selected sense amplifier in the second embodiment.

In the second to fourth embodiments, the selected sense amplifier and the unselected sense amplifier detect data "1." In the second to sixth embodiments, the operation of the sense amplifier 10 and the sense amplifier 20 is the same. Therefore, operation at the sense nodes SN0 and BSN0 in the sense amplifier 10 will now be described representatively.

Operation in the second embodiment conducted until the point t2 in time is similar to that in the first embodiment. Thereafter, the potential at the sense node SN0 becomes the potential VBLHM at the power supply SAP lower than the potential VBLH. In the unselected sense amplifier, therefore, supplement with holes is executed by using the potential VBLHM as shown in FIG. 8.

On the other hand, in the selected sense amplifier, the potentials on the column selection lines CSL and BCSL change at a point t2a in time. Immediately after the point t2a in time, the sense nodes SN0 and BSN0 assume the potentials VBLH (for example, 2.3 V) and VBLL (for example, −1.0 V), respectively. Thereafter, the selected sense amplifier operates in the same way as the selected sense amplifier in the first embodiment.

According to the second embodiment, the potential VBLHM lower than the potential VBLH for writing "1" is supplied to the sense node BSN in order to compensate for holes that disappear due to the charge pumping phenomenon. This is because for coping with the charge pumping phenomenon it is sufficient to supplement with several to ten and several holes during one writing/reading operation. For example, if the potential VBLH is 2.3 V, then the potential VBLHM should be in the range of 1.0 V to 2.0 V.

In the second embodiment, the charge pumping phenomenon can be prevented in the same way as the first embodiment. In addition, since the potential VBLHM is lower than the potential VBLH for writing data "1," power consumption can be further reduced.

THIRD EMBODIMENT

Figure 10:
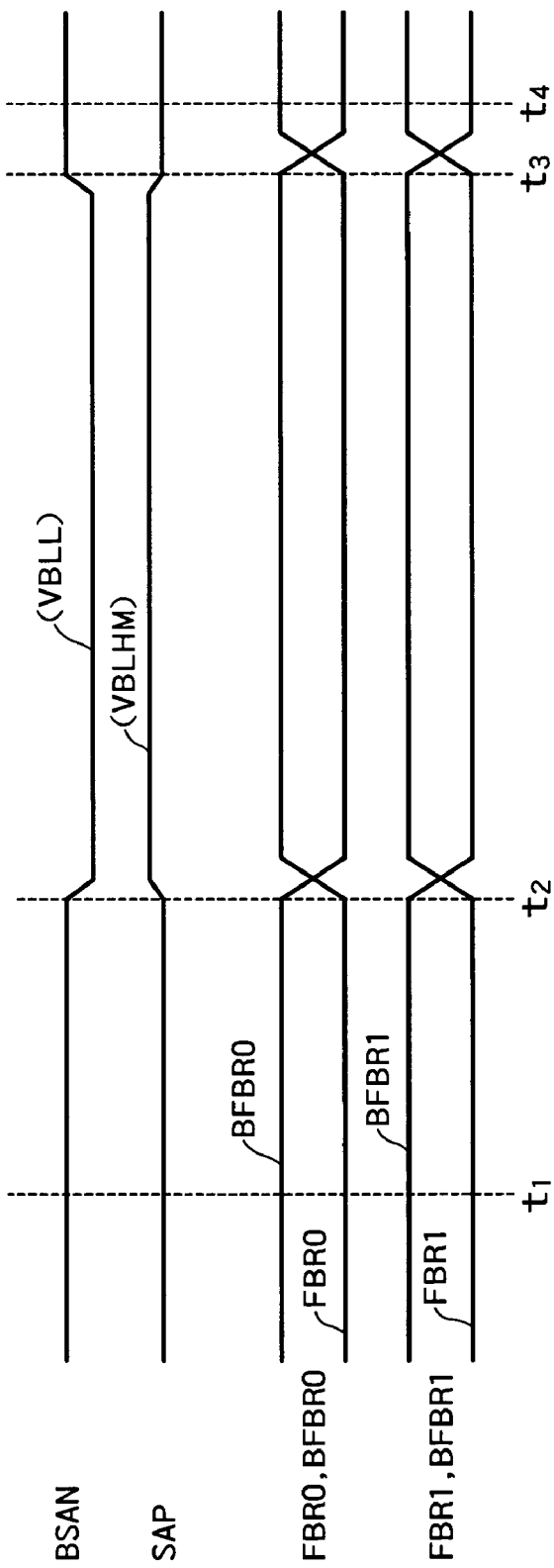
FIG. 10 is a timing diagram showing potential levels on respective signal lines in a third embodiment.

As shown in FIG. 10, a third embodiment differs from the second embodiment in that the potential at the power supply BSAN is VBLL (for example, −1.0 V) and it is lower than the inactive level (for example, 0 V). Furthermore, the third embodiment differs from the second embodiment in the operation of the signal lines FBR0 and BFBR0. A semiconductor memory device according to the third embodiment may have a configuration similar to that of the first embodiment shown in FIGS. 1 to 3. Furthermore, operations on the signal lines other than the power supplies BSAN and SAP and the signal lines FBR0 and BFBR0 may be similar to those shown in FIG. 4.

Figure 11:
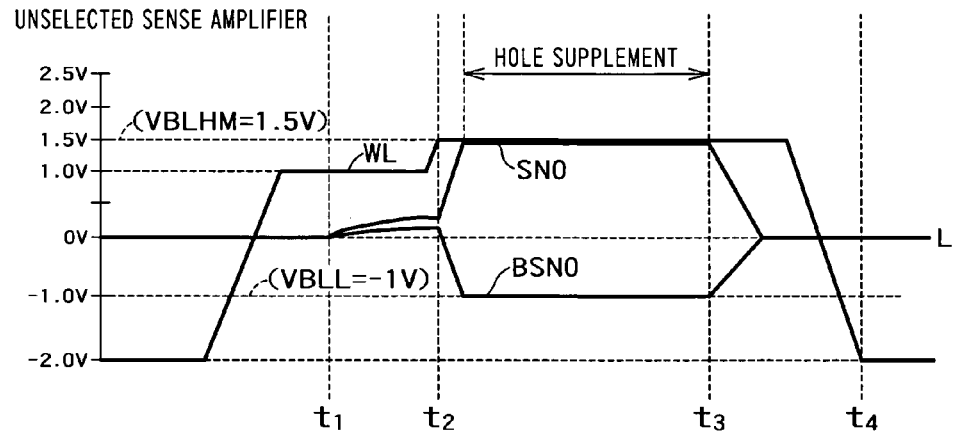
FIG. 11 is a timing diagram showing potential levels at sense nodes SN and BSN in an unselected sense amplifier in a third embodiment.
Figure 12:
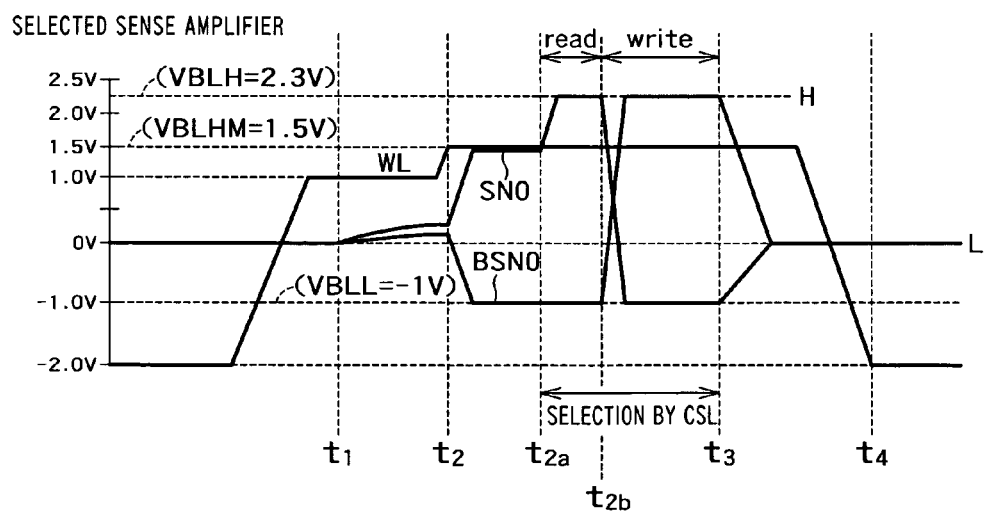
FIG. 12 is a timing diagram showing potential levels at sense nodes SN and BSN in a selected sense amplifier in a third embodiment.

FIG. 11 is a timing diagram showing potential levels at the sense nodes SN0 and BSN0 in an unselected sense amplifier in a third embodiment. FIG. 12 is a timing diagram showing potential levels at the sense nodes SN0 and BSN0 in a selected sense amplifier in the third embodiment. Since the operation of the sense amplifier 10 and the sense amplifier 20 is the same, operation at the sense nodes SN0 and BSN0 in the sense amplifier 10 will now be described representatively.

Operation at the sense node BSN0 in the third embodiment is equivalent to that in the second embodiment. Operation at the sense node SN0 in the third embodiment conducted until the point t2 in time is also similar to that in the second embodiment.

After the point t2 in time, the potential at the sense node BSN0 becomes the potential VBLL at the power supply BSAN as shown in FIG. 11. Furthermore, the signal lines FBR1 and BFBR1 respectively become the L level and the H level, and the signal lines FBR0 and BFBR0 also respectively become the L level and the H level. As a result, both the transfer gates TGR1 and TGR2 shown in FIG. 2 turn on. Therefore, the potential VBLHM at the sense node SN0 is applied to the bit line BBLR0, and the potential VBLL at the sense node BSN0 is applied to the bit line BLR0.

In the third embodiment, symmetrical potentials are thus supplied to the bit line pair BLR0 and BBLR0. Therefore, noise generated on the bit line pair BLR0 and BBLR0 can be reduced. In addition, in the third embodiment, hole supplement is conducted at the potential VBLHM lower than the potential VBLH in the unselected sense amplifier as shown in FIG. 11. Therefore, the third embodiment has an effect of low power consumption, as well.

FOURTH EMBODIMENT

Figure 13:
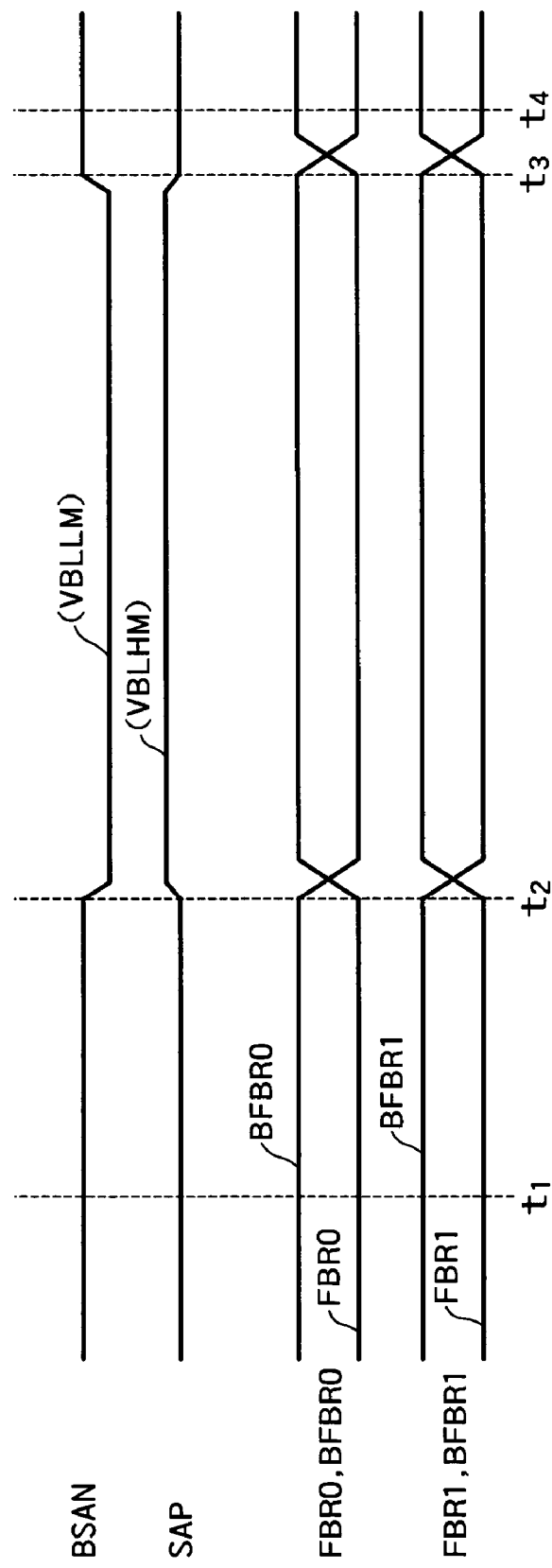
FIG. 13 is a timing diagram showing potential levels on respective signal lines in a fourth embodiment.

As shown in FIG. 13, a fourth embodiment differs from the third embodiment in that the potential at the power supply BSAN is VBLLM (for example, −0.7 V) and it lies between the VBLL (for example, −1.0 V) and the inactive level (for example, 0 V). A semiconductor memory device according to the fourth embodiment may have a configuration similar to that of the first embodiment shown in FIGS. 1 to 3. Furthermore, operations on the signal lines other than the power supplies BSAN and SAP and the signal lines FBR0 and BFBR0 may be similar to those shown in FIG. 4.

Figure 14:
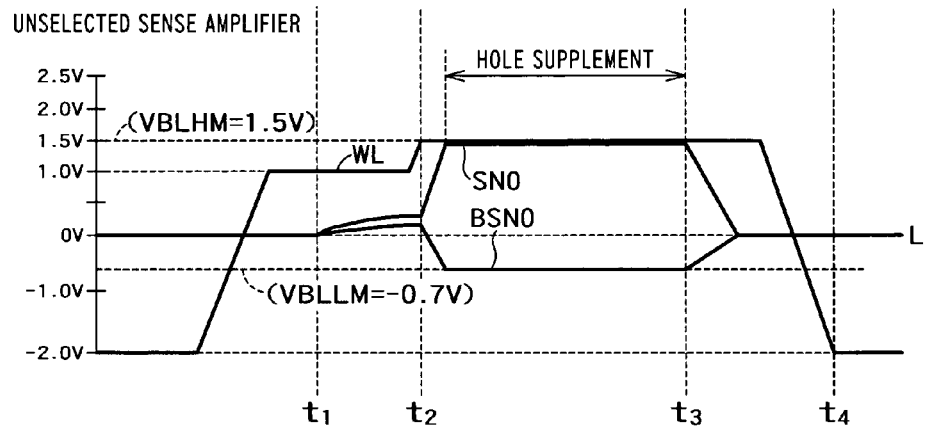
FIG. 14 is a timing diagram showing potential levels at sense nodes SN and BSN in an unselected sense amplifier in a fourth embodiment.
Figure 15:
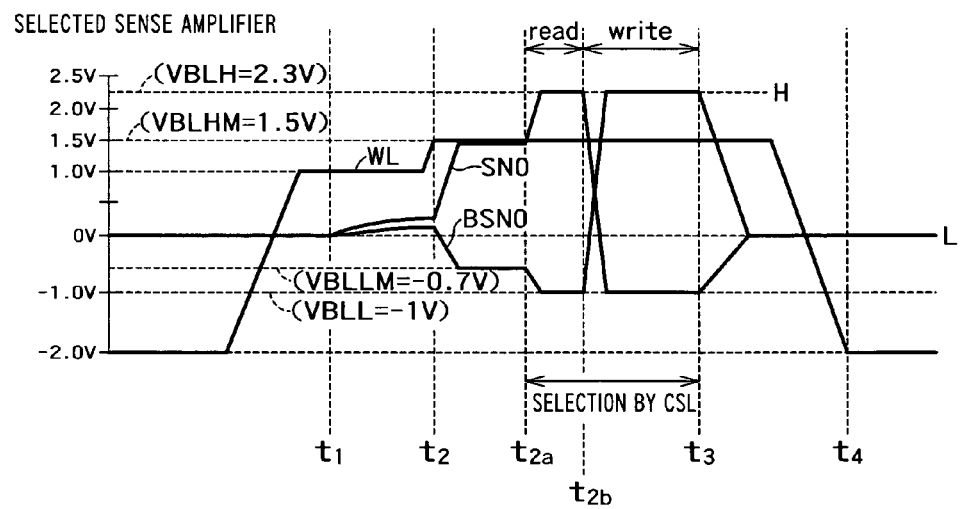
FIG. 15 is a timing diagram showing potential levels at sense nodes SN and BSN in a selected sense amplifier in a fourth embodiment.

FIG. 14 is a timing diagram showing potential levels at the sense nodes SN0 and BSN0 in an unselected sense amplifier in the fourth embodiment. FIG. 15 is a timing diagram showing potential levels at the sense nodes SN0 and BSN0 in a selected sense amplifier in the fourth embodiment.

Operation at the sense node BSN0 in the fourth embodiment is equivalent to that in the third embodiment. Operation at the sense node SN0 in the fourth embodiment conducted until the point t2 in time is also similar to that in the third embodiment.

After the point t2 in time, the potential at the sense node BSN0 becomes a potential VBLLM at the power supply BSAN as shown in FIG. 14. Operations on the signal lines FBR1, BFBR1, FBR0 and BFBR0 are similar to those in the third embodiment. As a result, both the transfer gates TGR1 and TGR2 shown in FIG. 2 turn on. Therefore, the potential VBLHM at the sense node SN0 is applied to the bit line BBLR0, and the potential VBLLM at the sense node BSN0 is applied to the bit line BLR0.

In the fourth embodiment, symmetrical potentials are supplied to the bit line pair BLR0 and BBLR0. In the same way as in the third embodiment, therefore, noise generated on the bit line pair BLR0 and BBLR0 can be reduced. In the fourth embodiment, hole supplement is conducted at the potential VBLHM lower than the potential VBLH in the unselected sense amplifier. Therefore, the fourth embodiment has an effect of low power consumption, as well. In addition, in the fourth embodiment, since the potential VBLHM (−0.7 V) lying between 0 V and the potential VBLL (−1.0 V) is supplied to the sense node SN0, the power consumption becomes lower than that in the third embodiment.

In the fourth embodiment, the potential VBLLM may be equal in absolute value to the potential VBLHM. As a result, noise generated on the bit line pair BLR0 and BBLR0 can be further reduced.

In the first to fourth embodiments, both the hole supplement and writing are finished at the point t3 in time as shown in, for example, FIGS. 5 and 6. In order to further reduce the power consumption, however, the hole supplement may be finished at a point in time earlier than the point t3 in time. In other words, latching time for conducting hole supplement may be shorter than the latching time for reading/writing.

The first to fourth embodiments aim at preventing the charge pumping phenomenon in the reading/writing operation. In other words, the first to fourth embodiments prevent data "1" from changing to data "0." On the other hand, fifth and sixth embodiments aim at executing refresh operation on only memory cells having data "0" stored therein at the time of refresh. Therefore, both the fifth and sixth embodiments relate to operation of the semiconductor memory device at the time of refresh.

When data is held in a memory cell, a negative potential of, for example, approximately −2 V is applied to the word line WL as shown in FIGS. 5 and 6 and the like. As a result of application of the negative potential, the body potential of data "0" is held lower than the potential at the source/drain of a cell transistor. It functions so as to store holes in the body region of the memory cell by using the leak current. Therefore, there is no problem for a memory cell having data "1" stored therein. In a memory cell having data "0" stored therein, however, there is a fear that the data "0" might gradually change to data "1."

In the fifth and sixth embodiments, therefore, refresh operation is conducted only for memory cells having data "0" stored therein.

FIFTH EMBODIMENT

Figure 16:
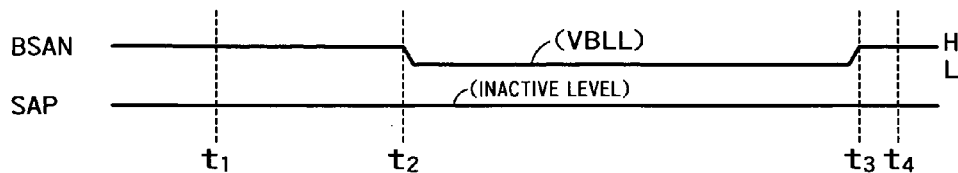
FIG. 16 is a timing diagram showing potential levels on respective signal lines in a fifth embodiment.

In a fifth embodiment, the potential at the power supply BSAN becomes VBLL (for example, −1.0 V) at the point t2 in time as shown in FIG. 16. A semiconductor memory device according to the fifth embodiment may have a configuration similar to that of the first embodiment shown in FIGS. 1 to 3. Furthermore, operations on the signal lines other than the power supplies BSAN and SAP may be similar to those shown in FIG. 4.

At the time of refresh, any sense amplifier is not selected. Therefore, the column selection line CSL and BCSL are at the L level and the H level, respectively. Therefore, the source node NN shown in FIG. 3 is connected to the power supply BSAN and the source node NP is connected to the power supply SAP.

Figure 17:
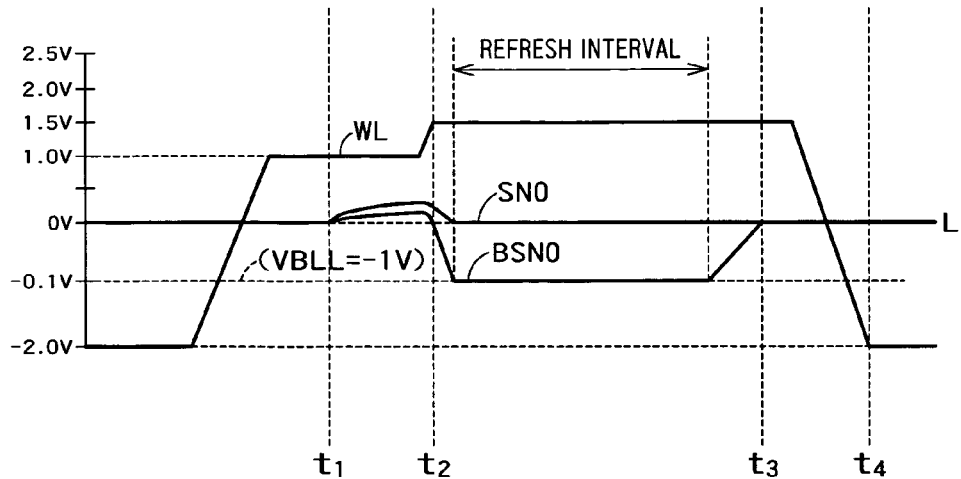
FIG. 17 is a timing diagram showing potential levels at sense nodes SN and BSN in a sense amplifier in a fifth embodiment.

FIG. 17 is a timing diagram showing potential levels at the sense nodes SN and BSN in the fifth embodiment. Operation conducted until the point t2 in time is similar to that in the first embodiment. Therefore, the sense nodes BSN0 and SN0 shown in FIG. 3 transfer data "0" and the reference potential, respectively. By the way, at this time, the potential at the sense node BSN0 transferring data "0" is higher than the potential at the sense node SN0 transferring the reference potential. This is because a memory cell having data "0" stored therein has no holes in the body region and consequently the threshold voltage is comparatively high.

At the point t2 in time, therefore, the sense nodes BSN0 and SN0 shown in FIG. 3 are connected respectively to the source nodes NP and NN, and potentials at them respectively become the potentials at the power supplies SAP and BSAN. After the point t2 in time, the potentials at the power supplies BSAN and SAP respectively become the VBLL (for example, −1 V) and the inactive level (for example, 0 V) as shown in FIG. 16. In the refresh interval, therefore, the potentials at the sense nodes SN0 and BSN0 respectively become the VBLL (−1 V) and the inactive level (0 V) as shown in FIG. 17.

Subsequently, in the same way as the first embodiment, the transfer gate TGR1 shown in FIG. 2 turns on, whereas the transfer gate TGR2 remains off. As a result, the potential VBLL at the sense node BSN0 is transferred to the bit line BLR0, and refresh operation can be executed on memory cells having data "0" stored therein.

According to the fifth embodiment, refresh operation is conducted on only memory cells having data "0." Therefore, the power consumption can be reduced.

SIXTH EMBODIMENT

Figure 18:
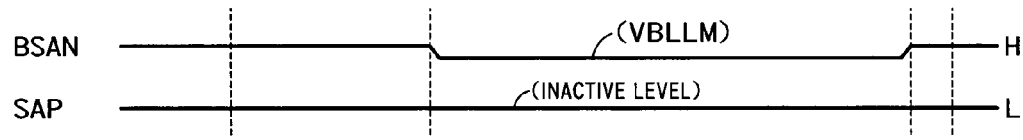
FIG. 18 is a timing diagram showing potential levels on respective signal lines in a sixth embodiment.
Figure 19:
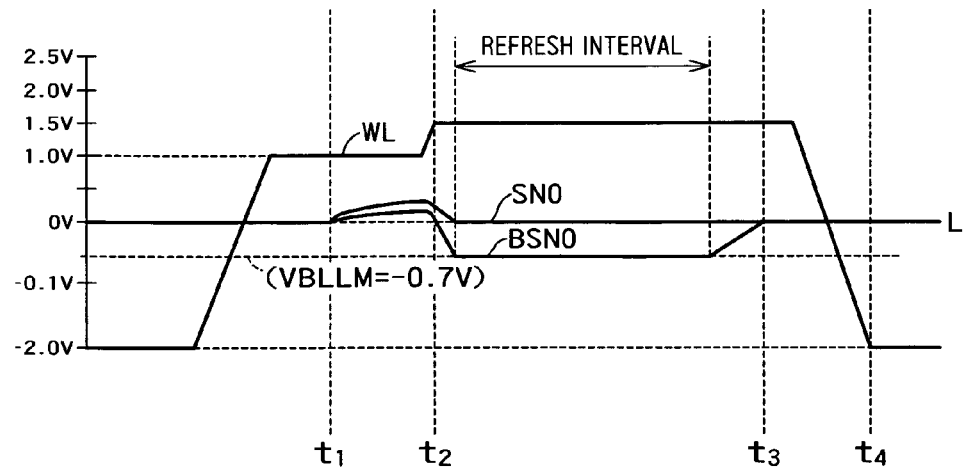
FIG. 19 is a timing diagram showing potential levels at sense nodes SN and BSN in a sense amplifier in a sixth embodiment.

A sixth embodiment differs from the fifth embodiment in that the potential at the power supply BSAN is the VBLLM (for example, −0.7 V) and it is lower in absolute value than the VBLL (for example, −1.0 V) as shown in FIG. 18. A semiconductor memory device according to the sixth embodiment may have a configuration similar to that of the first embodiment shown in FIGS. 1 to 3. Furthermore, operations on the signal lines other than the power supplies BSAN and SAP may be similar to those shown in FIG. 4.

For actually inverting data "1" to data "0," it is necessary to extract approximately 1,000 holes from the body region. However, the refresh operation is operation for removing holes stored in memory cells having data "0" stored therein by the leak current. Therefore, the number of holes to be removed is less than the number of holes at the time of writing data "0." Therefore, the potential level at the power supply BSAN at the time of refresh may be the potential VBLLM, which is lower in absolute value than the VBLL.

Thus, in the sixth embodiment, the potential level at the BSAN is low in absolute value. Therefore, the power consumption can be reduced.

The fifth and sixth embodiments can be combined with one of the first to fourth embodiments. As a result, it is possible to prevent the charge pumping phenomenon at the time of reading/writing, reduce the power consumption, and reduce the power consumption at the time of refresh.

SEVENTH EMBODIMENT

Figure 20:
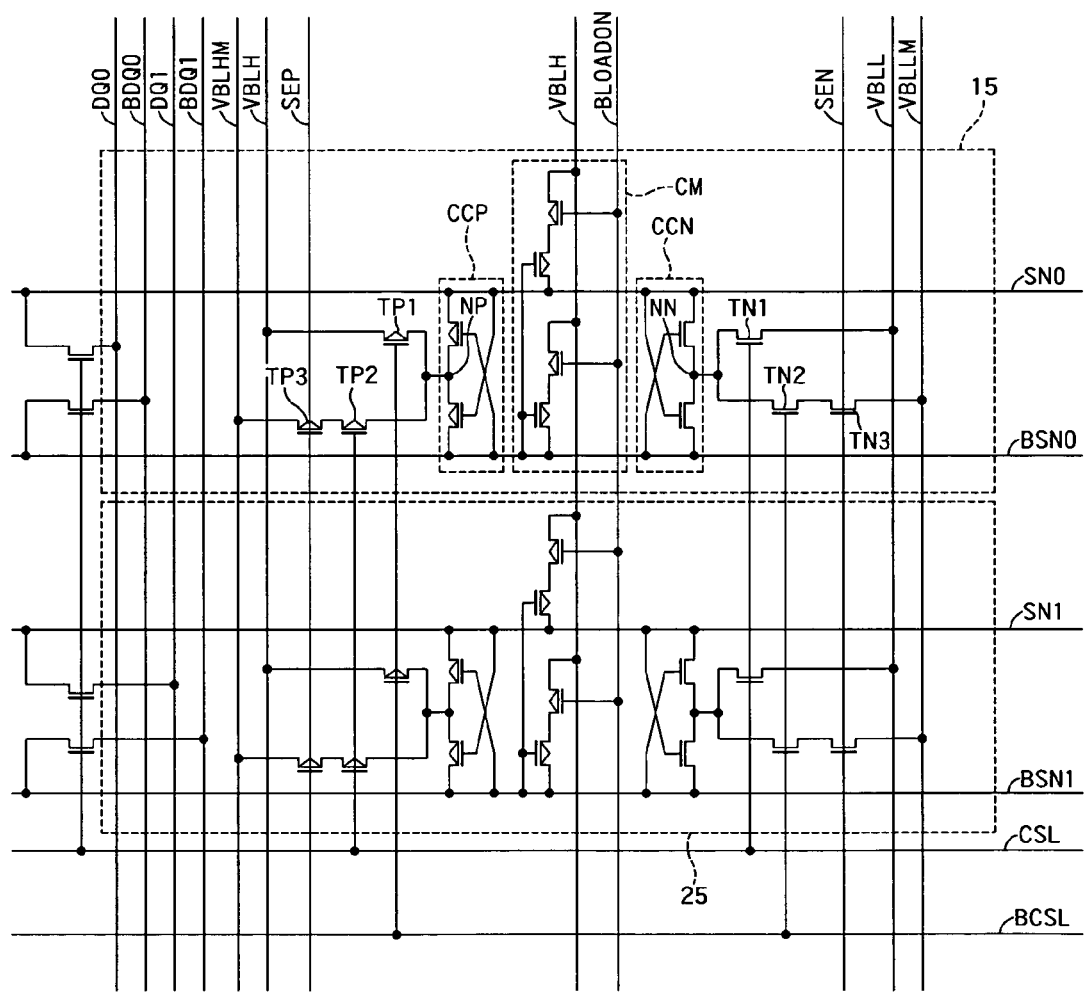
FIG. 20 is a circuit diagram showing a configuration of a semiconductor memory device 200 in a seventh embodiment according to the present invention.

FIG. 20 is a circuit diagram showing a configuration of a semiconductor memory device 200 according to a seventh embodiment of the present invention. In the first to sixth embodiments, the power supply SAP and the power supply BSAN are voltage signal sources each generating a predetermined potential at certain timing. In the seventh embodiment, the power supply SAP is separated into a constant voltage source VBLHM and a signal source SEP. The power supply BSAN is separated into a constant voltage source VBLLM and a signal source SEN. As a result, transistors TP3 and TN3 are added in the SA core 15. Other components may be similar to those in the first embodiment. The transistors TP3 and TN3 may be a P-MOSFET and an N-MOSFET, respectively.

The signal source SEP prescribes timing for connecting the voltage source VBLLM to the source node NP, and the signal source SEN prescribes timing for connecting the voltage source VBLHM to the source node NN. This timing may be similar to the timing at which the power supplies SAP and BSAN supply potentials to the source nodes NP and NN.

In the seventh embodiment, therefore, the voltage supplies VBLHM and VBLLM can be supplied to the source nodes NP and NN. Therefore, the seventh embodiment can operate in the same way as the fourth embodiment shown in FIGS. 14 and 15.

The seventh embodiment can operate in the same way as any of the first to third embodiments. For example, in the seventh embodiment, it is possible to omit the voltage source VBLHM and connect the transistor TP3 to the VBLH, or omit the voltage source VBLLM and connect the transistor TN3 to the VBLL. As a result, the seventh embodiment can operate in the same way as one of the first to third embodiments. Furthermore, the seventh embodiment can also operate in the same way as the fifth or sixth embodiment at the time of refresh.

What is claimed is:

1. A semiconductor memory device comprising:
    a memory cell including a floating body region assuming an electrical floating state, and storing data by storing charge in the floating body region or by discharging therefrom;
    memory cell arrays including a plurality of the memory cells arranged along a column and a row;
    a plurality of bit lines respectively provided in columns of the memory cell array and connected to the memory cells disposed along the respective columns;
    a plurality of word lines respectively provided in rows of said memory cell array and connected to the memory cells disposed along the respective rows;
    a column selection line to select a bit line to read/write data from/into the memory cells; and
    a sense amplifier connected to a first bit line and a second bit line in a memory cell array via transfer gates, the sense amplifier comprising a first sense node connected to the first bit line via a transfer gate, a second sense node connected to the second bit line via a transfer gate, a first cross couple including two switching elements of first conduction type connected in series between the first sense node and the second sense node, and a second cross couple including two switching elements of second conduction type connected in series between the first sense node and the second sense node, a first node between the two switching elements in the first cross couple and a second node between the two switching elements in the second cross couple being respectively connected to different power supplies via a plurality of routes, the sense amplifier selecting the routes on the basis of a potential on the column selection line.

2. The semiconductor memory device according to claim 1, wherein
    the power supplies comprise a first power supply and a second power supply to supply a potential to a bit line selected by the column selection line, and a third power supply and a fourth power supply to supply a voltage to a bit line that is not selected by the column selection line, and
    the sense amplifier includes a first route between the first power supply and the first cross couple, a second route provided between the third power supply and the first cross couple, a third route between the second power supply and the second cross couple, and a fourth route provided between the fourth power supply and the second cross couple, the sense amplifier selecting either the first and third routes or the second and fourth routes on the basis of the potential on the column selection line.

3. The semiconductor memory device according to claim 2, wherein
    the column selection line includes a first column selection line transferring a signal and a second column selection line transferring an inversion signal of the signal on the first column selection line,
    the sense amplifier further comprises a switching element of first conduction type connected to the first column selection line at the gate thereof and switching respectively the first route, a switching element of first conduction type connected to the second column selection line at the gate thereof and switching respectively the second route, a switching element of second conduction type connected to the second column selection line at the gate thereof and switching respectively the third route, and a switching element of second conduction type connected to the first column selection line at the gate thereof and switching respectively the fourth route.

4. The semiconductor memory device according to claim 3, wherein when reading/writing data from/into the memory cells,
each of the first and second power supplies outputs a reading/writing potential to be applied to a bit line selected for reading/writing, and
the third or fourth power supply outputs a potential lying between the reading/writing potentials and the ground potential.

5. The semiconductor memory device according to claim 3, wherein when reading/writing data from/into the memory cells,
the first power supply outputs a "1" reading/writing potential to be applied to the bit line when reading/writing data "1",
the second power supply outputs a "0" reading/writing potential to be applied to the bit line when reading/writing data "0",
the third power supply outputs the "1" reading/writing potential, and
the fourth power supply outputs ground potential.

6. The semiconductor memory device according to claim 3, wherein when reading/writing data from/into the memory cells,
the first power supply outputs a "1" reading/writing potential to be applied to the bit line when reading/writing data "1",
the second power supply outputs a "0" reading/writing potential to be applied to the bit line when reading/writing data "0",
the third power supply outputs a potential lying between the "1" reading/writing potential and the ground potential, and
the fourth power supply outputs ground potential.

7. The semiconductor memory device according to claim 3, wherein when reading/writing data from/into the memory cells,
the first power supply outputs a "1" reading/writing potential to be applied to the bit line when reading/writing data "1",
the second power supply outputs a "0" reading/writing potential to be applied to the bit line when reading/writing data "0",
the third power supply outputs a potential lying between the "1" reading/writing potential and the ground potential, and
the fourth power supply outputs the "0" reading/writing potential.

8. The semiconductor memory device according to claim 3, wherein when reading/writing data from/into the memory cells,
the first power supply outputs a "1" reading/writing potential to be applied to the bit line when reading/writing data "1",
the second power supply outputs a "0" reading/writing potential to be applied to the bit line when reading/writing data "0",
the third power supply outputs a potential lying between the "1" reading/writing potential and the ground potential, and
the fourth power supply outputs a potential lying between the "0" reading/writing potential and the ground potential.

9. The semiconductor memory device according to claim 3, wherein when refreshing data in the memory cells,
the third power supply outputs ground potential, and
the fourth power supply outputs a "0" reading/writing potential to be applied to the bit line when reading/writing data "0".

10. The semiconductor memory device according to claim 3, wherein when refreshing data in the memory cells,
the third power supply outputs ground potential, and
the fourth power supply outputs a potential lying between a "0" reading/writing potential and the ground potential, the "0" reading/writing potential being applied to the bit line when reading/writing data "0".

11. The semiconductor memory device according to claim 2, wherein when reading/writing data from/into the memory cells,
each of the first and second power supplies outputs a reading/writing potential to be applied to a bit line selected for reading/writing, and
the third or fourth power supply outputs a potential lying between the reading/writing potentials and the ground potential.

12. The semiconductor memory device according to claim 2, wherein when reading/writing data from/into the memory cells,
the first power supply outputs a "1" reading/writing potential to be applied to the bit line when reading/writing data "1",
the second power supply outputs a "0" reading/writing potential to be applied to the bit line when reading/writing data "0",
the third power supply outputs the "1" reading/writing potential, and
the fourth power supply outputs ground potential.

13. The semiconductor memory device according to claim 2, wherein when reading/writing data from/into the memory cells,
the first power supply outputs a "1" reading/writing potential to be applied to the bit line when reading/writing data "1",
the second power supply outputs a "0" reading/writing potential to be applied to the bit line when reading/writing data "0",
the third power supply outputs a potential lying between the "1" reading/writing potential and the ground potential, and
the fourth power supply outputs ground potential.

14. The semiconductor memory device according to claim 2, wherein when reading/writing data from/into the memory cells,
the first power supply outputs a "1" reading/writing potential to be applied to the bit line when reading/writing data "1",
the second power supply outputs a "0" reading/writing potential to be applied to the bit line when reading/writing data "0",
the third power supply outputs a potential lying between the "1" reading/writing potential and the ground potential, and
the fourth power supply outputs the "0" reading/writing potential.

15. The semiconductor memory device according to claim 2, wherein when reading/writing data from/into the memory cells,
the first power supply outputs a "1" reading/writing potential to be applied to the bit line when reading/writing data "1", the second power supply outputs a "0" reading/writing potential to be applied to the bit line when reading/writing data "0", the third power supply outputs a potential lying between the "1" reading/writing potential and the ground potential, and the fourth power supply outputs a potential lying between the "0" reading/writing potential and the ground potential.

16. The semiconductor memory device according to claim 2, wherein when refreshing data in the memory cells, the third power supply outputs ground potential, and the fourth power supply outputs a "0" reading/writing potential to be applied to the bit line when reading/writing data "0".

17. The semiconductor memory device according to claim 2, wherein when refreshing data in the memory cells, the third power supply outputs ground potential, and the fourth power supply outputs a potential lying between a "0" reading/writing potential and the ground potential, the "0" reading/writing potential being applied to the bit line when reading/writing data "0".

18. The semiconductor memory device according to claim 1, wherein the memory cells are FBCs.

19. The semiconductor memory device according to claim 1, wherein the sense amplifier have a folded bit line configuration.

20. A semiconductor memory device comprising:

a memory cell including a floating body region assuming an electrical floating state, and storing data by storing charge in the floating body region or discharging therefrom;

memory cell arrays each including a plurality of the memory cells arranged along a column and a row;

a plurality of bit lines respectively provided in columns of the memory cell array and connected to the memory cells disposed along the respective columns;

a plurality of word lines respectively provided in rows of said memory cell array and connected to the memory cells disposed along the respective rows;

a column selection line to select a bit line for reading/writing data from/into the memory cells; and a sense amplifier respectively connected to a first bit line and a second bit line in a memory cell array via transfer gates, wherein when in the sense amplifier the first and second bit lines are unselected at the time of reading/writing, the sense amplifier reading data in a memory cell connected to the first bit line and a selected word line by using the first bit line, and reading reference data serving as reference when detecting data in the memory cell by using the second bit line, then the sense amplifier applying a supplement voltage and ground potential to the first bit line, the supplement voltage lying between a reading/writing potential to be applied to a bit line selected for reading/writing.

* * * * *